United States Patent [19]

Abe

[11] Patent Number: 4,887,969

[45] Date of Patent: Dec. 19, 1989

[54] IC SOCKET

[75] Inventor: Shunji Abe, Yokohama, Japan

[73] Assignee: Yamaichi Electric Mfg. Co., Ltd., Tokyo, Japan

[21] Appl. No.: 195,840

[22] Filed: May 19, 1988

[30] Foreign Application Priority Data

May 22, 1987 [JP] Japan .................... 62-126337

[51] Int. Cl.$^4$ ........................................... H01R 23/72
[52] U.S. Cl. ........................................ 439/73; 439/331
[58] Field of Search ................................ 439/68–73, 439/152, 155, 159, 525, 526, 912, 296, 330, 331; 324/158 F

[56] References Cited

U.S. PATENT DOCUMENTS

| 3,805,159 | 4/1974 | Richelmann | 439/893 |
| 4,341,433 | 7/1982 | Cherian et al. | 439/525 |
| 4,407,555 | 10/1983 | Lockard | 439/296 |
| 4,739,257 | 4/1988 | Jenson et al. | 439/71 |

FOREIGN PATENT DOCUMENTS 57-158571  9/1982  Japan .
58-30295   2/1983  Japan .

Primary Examiner—Neil Abrams
Attorney, Agent, or Firm—Wenderoth, Lind & Ponack

[57] ABSTRACT

An IC socket has a socket body having an IC package accommodating space therein; an IC mounting table disposed in the IC package accommodating space and adapted to support an IC package thereon; and a plurality of contacts planted in a socket body portion at the periphery of the mounting table; the plurality of contacts each having a resilient contact piece, IC terminals of the IC package, when the IC package is supported on the mounting table, being able to contact with the resilient contact pieces of the contacts, wherein the IC package mounting table is formed with a plurality of contact positioning grooves for receiving the resilient contact pieces therein, so that the resilient contact pieces are regulated by a wall for defining the positioning grooves.

3 Claims, 4 Drawing Sheets

IC SOCKET

BACKGROUND OF THE INVENTION

1. Field of the Invention

This invention relates to an IC socket in which an IC package is supported on an IC package mounting table which a socket body is provided with and, in that state, able to contact with contacts.

2. Brief Description of the Prior Art

As disclosed in Japanese Utility Model Application Early Laid-open Publication No. Sho 58-30295, there is a known IC socket, in which an IC package mounting table for supporting an IC package thereon is vertically movably disposed within an IC accommodating portion of a socket body, and a plurality of contacts are planted in a socket body portion at the periphery of the mounting table. The mounting table, while supporting the IC package thereon, is lowered and in the meantime, IC terminals of the IC package are resiliently contacted with resilient contact pieces of the contacts.

In the above-mentioned conventional IC socket, the contacts to be contacted with IC leads are usually positioned at the socket body and the IC package having the IC leads to be contacted with the contacts is positioned at the IC package mounting table, thereby to obtain a correspondence between the contacts and the IC terminals.

However, in the conventional IC socket, even if the contacts and the IC terminals are individually separately positioned, the contacts are not regulated by the IC package mounting table at all, and therefore, the relative position of the contacts with respect to the IC package correctly mounted on the IC package mounting table is not ensured. This is particularly true when the IC terminals are closely spaced. In that case, the correct positioning is difficult to obtain and thus unreliable.

The present invention has been accomplished in order to overcome the above-mentioned problems.

SUMMARY OF THE INVENTION

It is therefore a general object of the present invention to provide an IC socket which is simple in structure and in which an IC mounting table has an IC package supporting function and at the same time it has a function for positioning the contacts, so that the relative position of the contacts with respect to the IC terminals is correctly ensured.

In order to achieve the above object, there is essentially provided an IC socket comprising a socket body having an IC package accommodating space therein; an IC mounting table disposed in the IC package accommodating space and adapted to support an IC package thereon; and a plurality of contacts planted in a socket body portion at the periphery of the mounting table; the plurality of contacts each having a resilient contact piece, IC terminals of the IC package, when the IC package is supported on the mounting table, being able to contact with the resilient contact pieces of the contacts, wherein the IC package mounting table is formed with a plurality of contact positioning grooves for receiving the resilient contact pieces therein, so that the resilient contact pieces are regulated by a wall for defining the positioning grooves.

According to an IC socket of the present invention, the contacts planted in the socket body, particularly the resilient contact pieces for contacting with the IC terminals and the IC package mounting table are correlated, and the resilient contact pieces are positioned by a positioning means provided on the IC package mounting table, thereby to facilitate the contact with the IC terminals of the IC package correctly mounted on the IC package mounting table. Accordingly, the IC package mounting table can have the function for positioning the contacts in addition to its function for correctly mounting the IC package thereon. Therefore, there can be correctly maintain the relative position of the IC terminals with respect to the contacts by positioning the resilient contact pieces in the vicinity of the contacting portion thereof with the IC terminals at the IC package mounting table.

With the above-mentioned constitution, the present invention can solve the problems related to the correct positioning of the IC terminals with respect to the contacts in an IC socket provided with an IC package mounting table. Furthermore, since the IC package mounting table has the function for positioning the contacts with respect to the IC terminals, there can be obtained a highly reliable contact. Thus, the present invention can effectively cope with the IC terminals of very small pitches.

For a better understanding of the present invention, together with other and further objects and attendant advantages thereof, reference is made to the following description, taken in connection with the accompanying drawings, while its scope will be pointed out in the appended claims.

DETAILED DESCRIPTION OF THE EMBODIMENT

The embodiment of the present invention will be described with reference to the accompanying drawings.

Figure 1:
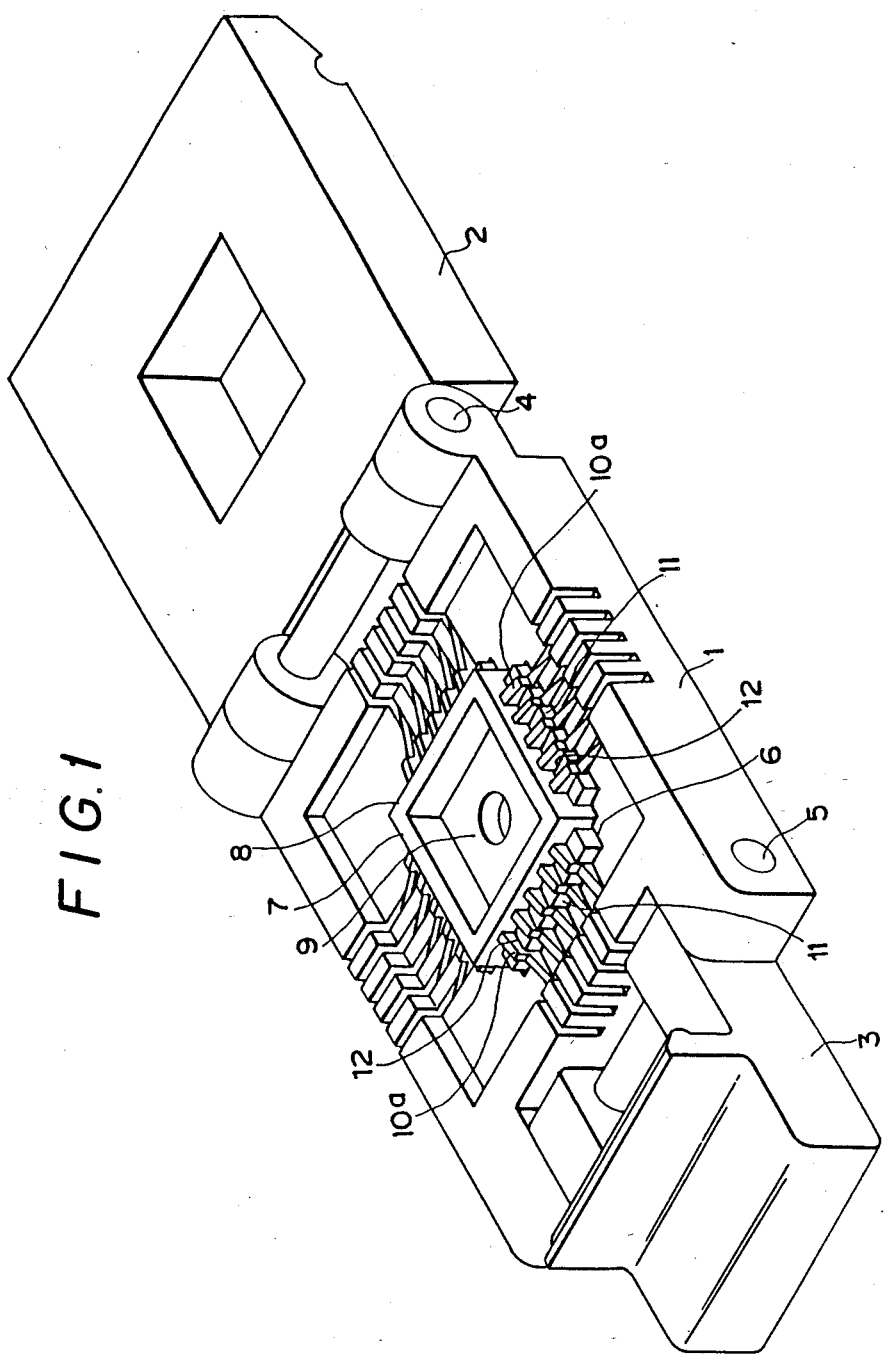
FIG. 1 is a perspective view of an IC socket according to one embodiment of the present invention.
Figure 2:
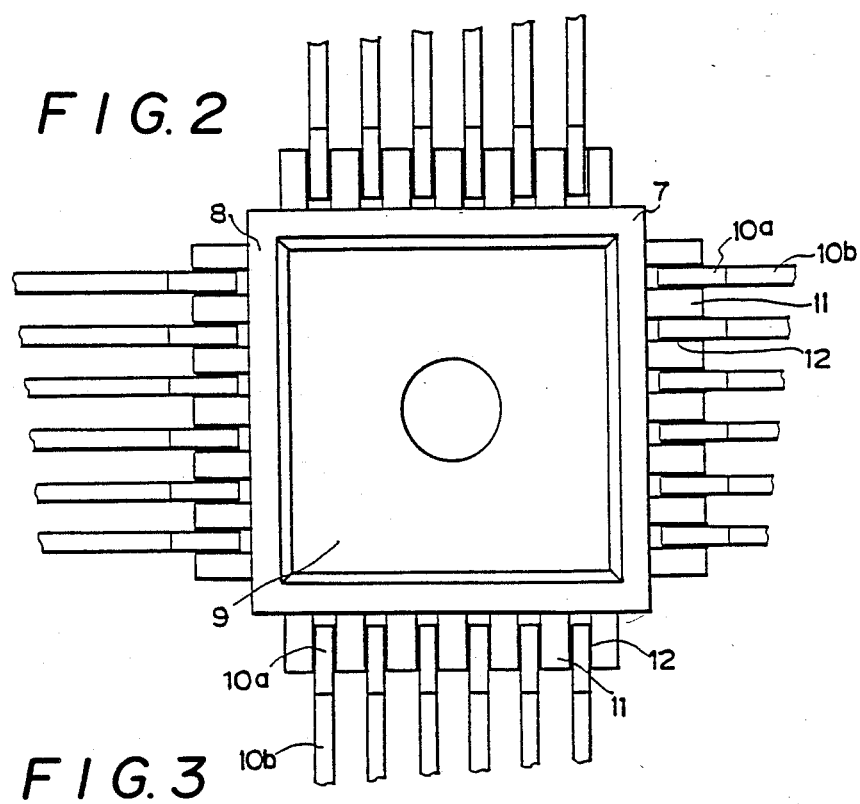
FIG. 2 is a plan view showing the correlation between means for positioning an IC mounting table and resilient contact pieces of contacts.
Figure 3:
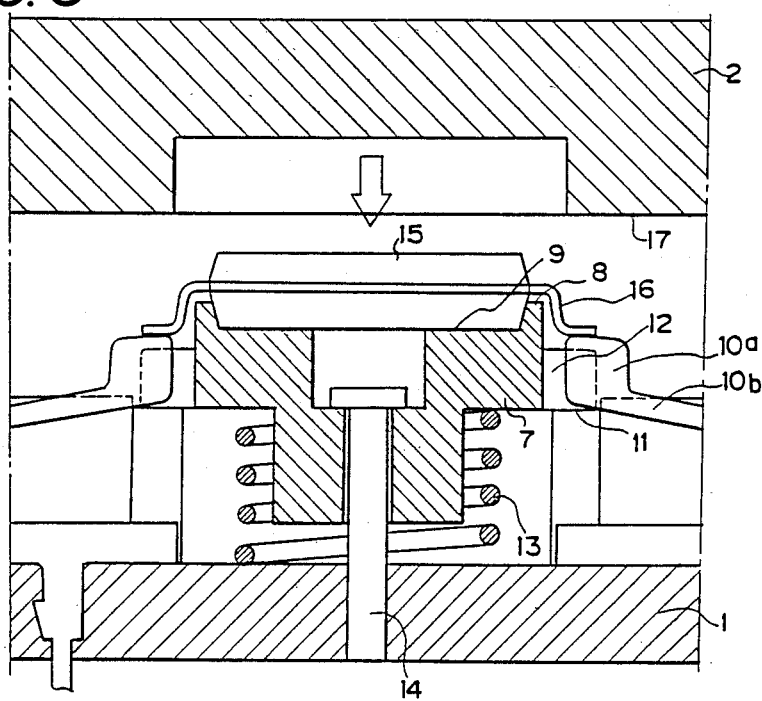
FIG. 3 is a sectional view of the IC mounting table of FIG. 1 with an IC package mounted thereon and showing a state before the IC package is pressed.

FIG. 1 through FIG. 3 illustrate one embodiment of the present invention, in which a positioning groove is formed in an IC package mounting table as means for positioning contacts at equal pitches as the contacts.

In the figures, reference numeral 1 denotes an IC socket body of a square insulation substrate. The socket body 1 is provided with an IC package accommodating space 6 corresponding to an IC package and with a plurality of contacts 3 corresponding to terminals 16 of the IC package 15. As the IC package accommodating space 6, a square window is formed at the central portion of the socket body 1 and an IC package mounting table 7 is vertically movably disposed within the IC package accommodating space 6. Otherwise, instead of vertically movably disposing the IC package mounting table 7, the IC package mounting table 7 may be slightly horizontally movably disposed within the IC accommodating space 6. Otherwise, the IC package mounting table 7 may be vertically movably and slightly horizontally movably disposed within the IC accommodating space 6. The outer periphery of the IC accommodating space 6 is provided at its four sides or its two sides with a plurality of contacts 10 thereby to plant the contacts in the socket body 1.

As means for vertical moving the IC package mounting table 7, the package mounting table 7 is resiliently supported by a spring 13 for energizing the IC package mounting table 7 upward within the window as the IC package accommodating space 6, and the the IC package mounting table is moved downward against the force of the spring 13 and moved upward according to the force of the spring 13. The mounting table 7 is provided with a pin 14 vertically loosely inserted into the central portion thereof. The lower end of the pin 14 is secured to the socket body portion under the window by suitable means such as thread-engagement, press fit, adhesion, or the like. A head portion at the upper end of the pin 14 is engaged with the mounting table 7 so as to prevent the pin 14 from coming off, whereby the upper limit of the upward movement of the IC package mounting table 7 is established and, at the same time, the mounting table 7 is integrally assembled with respect to the socket body 1.

Figure 7:
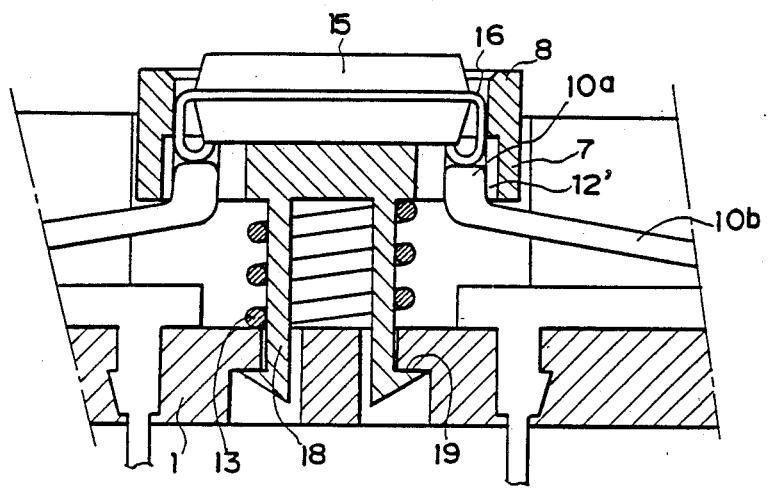
FIG. 7 is a side view of an IC socket according to still another embodiment.

The mounting table 7 may be integrally assembled with the socket body 1 by other means than the pin 14. For example, the IC package mounting table 7, as shown in FIG. 7, is integrally formed with an engaging leg 18 extending downward therefrom, the engaging leg 18 is inserted into a socket body portion corresponding to the window as the IC package accommodating space 6, and the engaging leg 18 is formed at its lower end with a hook portion for engaging with a step portion 19 formed in the inserting hole, whereby the upper limit of the upward movement of the mounting table 7 is established against the force of the spring 13 and, at the same time, the mounting table 7 is integrally assembled with the socket body 1.

As the spring 13, for example, a coil spring may be employed. In this case, the coil spring 13 is interposed between the IC package mounting table 7 and the socket base portion located immediately under the IC package mounting table 7, and disposed in its compressed state around the pin 14 or the engaging leg 18.

In addition, the contacts 10 are planted in the socket body portion at the outer periphery of the mounting table 7 and each of the contacts 10 has a resilient contact piece 10b extending toward the mounting table 7 from the planting portion.

In the embodiment of FIG. 1 through FIG. 3, there is exemplified a mount-contact type IC socket in which the IC terminal 16 of the IC package 15 is mounted on the contact 10 to obtain a contact therebetween. The resilient contact piece 10b lies extending in the horizontal direction so as to exhibit a vertical resiliency. The resilient contact piece 10b is formed at its free end with a contacting portion 10a, and the contacting portion 10 is located at the outer peripheral portion of the IC package mounting table 7.

With the above-mentioned construction, the IC package mounting table 7 is provided at its outer peripheral portion with means for positioning the resilient contact piece 10b of the contact 10.

In the illustrated embodiment of FIG. 1 through FIG. 3, as the positioning means, a plurality of positioning grooves 12 defined by a partition wall 11 are formed at the outer peripheral portion of the IC package mounting table 7 opposite the contacts 10.

Each of the positioning grooves 12 receives therein the corresponding contact 10 so as to ensure the position of the contact 10. As shown in the figures, the same number of the positioning grooves 12 as that of the contacts 10 are disposed at the contact pitch and therefore, at the IC terminal pitch. Otherwise, the positioning grooves 12 are disposed for each predetermined number of contacts, and the resilient contact pieces 10b are received in the positioning grooves 12 so as to ensure the position of the contacts 10.

Preferably, the free end portion forming the contacting portion 10a of the resilient contact piece 10b, as illustrated in the figures, is inserted in the positioning groove 12, whereby the resilient contact piece 10b is effectively positioned at the contacting portion 10a nearest to the IC terminal 16.

In the present invention, it is intended that the resilient contact piece 10b be positioned at the IC package mounting table side. It is also within the scope of the invention that the resilient contact piece 10b be positioned at other parts than on the contacting portion 10a, such as for example that part continued from the contacting portion 10a, is rested in the positioning groove 12 so as to ensure the position of the resilient contact piece 10b. This is better understood with other embodiments which will be described hereinafter.

Due to the above-mentioned arrangement, the IC package mounting table 7 permits each partition wall 11 to be interposed between the adjacent resilient contact pieces 10b between the adjacent contacting portions 10a and is vertically moved against the force of the spring 13 or energized by the force of the spring 13 while regulating the side surface thereof by the inner wall of the positioning groove 12. Accordingly, the resilient contact pieces of the contacts 10 and the IC package mounting table 7 are placed in a relation for offsetting the position with respect to each other through the positioning means. Accordingly, when the IC package mounting table 7 is slightly moved rightward and leftward or back and forth, the resilient contact pieces 10b disposed at the side perpendicular to the direction of slight movement are also moved in the same direction following the slight movement of the IC package mounting table 7 through the positioning means. As a consequence, the relative position can be correctly maintained.

The IC package 15 is correctly mounted on the IC package mounting table 7. As means for positioning the IC package 15, the IC package mounting table 7 is provided with, for example, a picture frame like positioning wall 8 extending upward from its marginal portion so that the side surface of the IC package 15 mounted on the IC package mounting table 7 is regulated by the positioning wall 8. Alternatively, the IC package 15 may be mounted on the positioning wall 8 of the IC package mounting table 7 in such a manner as that the IC package 15 is floated from the upper surface 9 of the mounting table 7.

Because of the above-mentioned arrangement, the IC terminals 16 projecting sideward from the IC package 15 and the contacting portions 10a of the resilient contact pieces 10b are placed in a one-to-one corresponding relation.

When the IC package 15 is mounted on the IC package mounting table 7, as shown in, FIG. 3, the IC terminals 16 are either brought into contact with the contacting portions 10a or brought to a position immediately above the contacting portions 10a with a small space therebetween and opposite the contacting portions 10a.

In the above-mentioned corresponding state, when the IC package 15 is subjected to a downward force as shown by an arrow in FIG. 3, the IC package 15 and the IC package mounting table 7 are lowered against the force of the spring 13, and the contacting portions 10a are pressurized by the IC terminals due to the descending movement, thereby to resiliently displace the resilient contact pieces 10b downward against the resilient force and obtain a resilient contact with the IC terminals 16 by the restoring force thereof. The IC package mounting table 7 may be horizontally movably disposed instead of vertically movably disposed as previously mentioned, thereby to obtain the desired contact.

Figure 4:
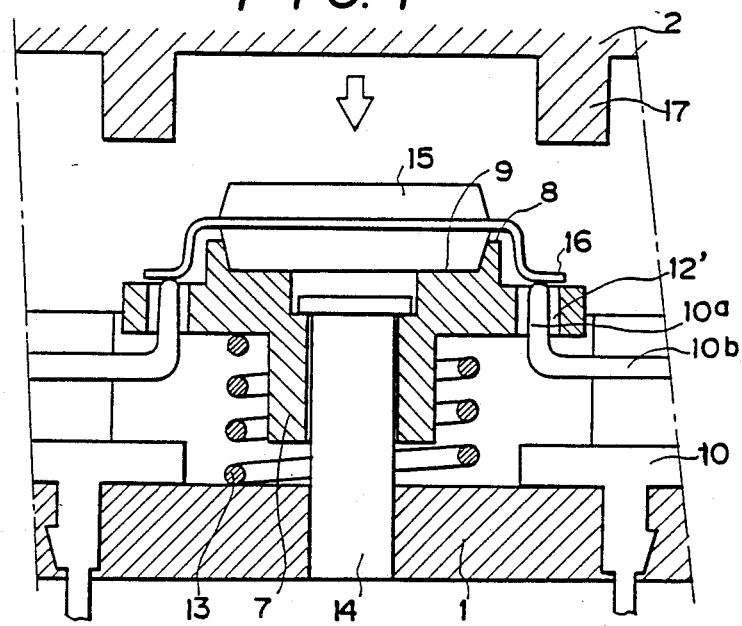
FIG. 4 is a similar sectional view but showing another embodiment.
Figure 5:
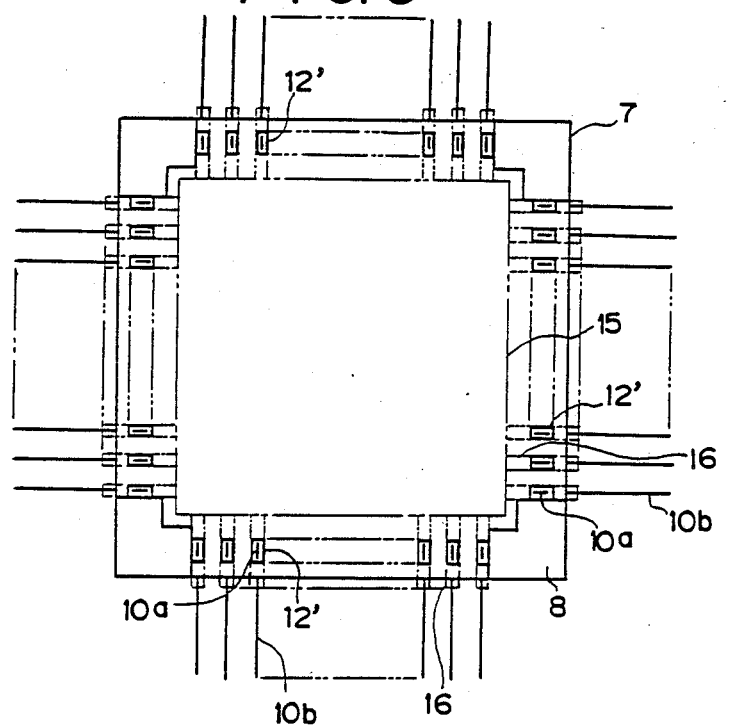
FIG. 5 is a plan view showing the correlation between the contacts of the means for positioning the IC package positioning table and IC terminals in the embodiment of FIG. 4.
Figure 6:
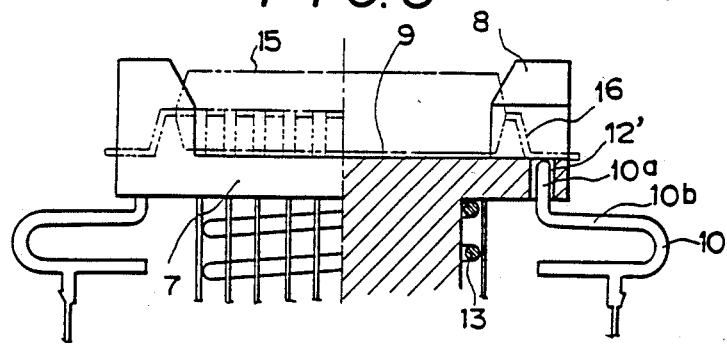
FIG. 6 is a side view showing the IC package mounting table, partly in section, in the embodiment of FIG. 4.

FIG. 4 through FIG. 6 illustrate another example of the positioning means.

In this example, a positioning hole 12' is employed as the positioning means. A plurality of positioning holes 12' are arranged at the same pitches on the outer peripheral portion of the IC package mounting table 7 in the same manner as previously described, and the resilient contact pieces 10b of the contacts are extended toward the positioning holes 12'. The free end of each resilient contact piece 10b is provided with a contacting portion 10a bending upward. The contacting portion 10a is inserted into the positioning hole 12' and placed opposite the IC terminal 16. By this, the resilient contact piece 10b is regulated the side surface at its contacting portion by the inner wall of the positioning hole 12'. As a result, the relative position between the resilient contact piece 10b and the IC package mounting table 7, and therefore the IC package 15 correctly mounted thereon can be obtained.

With the above-mentioned arrangement, the IC package 15 is mounted on the IC package mounting table 7. The side surfaces of the IC terminals at the ends of each row are regulated by the positioning walls 8 provided on the corners of the mounting table 7, and in the meantime, the IC package 15 is positioned. By pressurizing the IC package 15 downward, a resilient contact between the IC terminal 15 and the resilient contact piece 10b can be obtained in the same manner as previously described.

In each of the above-mentioned embodiments, as means for pressing the IC package 15, an IC pressing cover 2 is pivotably attached to one end of the socket body 1 by a shaft 4, and a lock lever 3 for engaging with the free end of the IC pressing cover 2 closed on the socket body 1 in order to maintain the closure is pivotably attached to the other end of the socket body 1 by a shaft 5.

The IC pressing cover 2 is provided at its inner surface with an IC pressing portion 17 opposite the IC terminal 16, so that the closure of the cover 2 presses the upper surface of the IC terminal 16 to obtain a resilient contact with the resilient contact piece 10b.

In the IC press, the IC terminal 16 is pressed and at the same time, the IC package mounting table 7 itself is pressed at the positioning groove 12 or the positioning hole 12'. As a result, the IC package mounting table 7 is parallelly shifted downward together with the IC package 15.

FIG. 7 is an example in which the present invention is applied to a generally called J-bend type IC package.

The IC package is provided at its side surface with an IC terminal 16 bent generally in a J-shape, and the side surface of the IC terminal 16 is regulated by the positioning wall 8 of the mounting table 7 for correctly mounting the IC package on the IC package mounting table 7. At the same time, the IC terminal 16 is contacted with the resilient contact piece 10b received in the positioning hole 12' or the positioning groove 12 when the IC package is correctly mounted on the IC package mounting table 7.

In this case, it is preferable that the lower end of the IC terminal bent in a J-shape, as shown in FIG. 7, is dropped into the positioning hole 12' so as to contact with the contacting portions 10a within the positioning hole 12' when the IC package is correctly mounted on the IC package mounting table 7, and the relative position of both of them is established within the common positioning hole 12' or the positioning groove 12.

Figure 8:
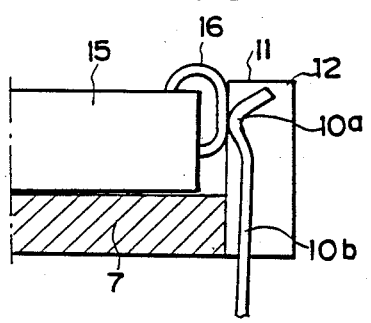
FIG. 8 is an enlarged sectional view of a modified embodiment of the positioning means.

FIG. 8 illustrates an example in which a side surface contact type contact is employed as opposed the above-mentioned embodiments in which mount-contact type contact is employed.

The IC package mounting table 7 is provided at its marginal portion with the positioning holes 12' or the positioning grooves 12 corresponding to the resilient contact pieces 10b in the same manner as previously described, the resilient contact pieces 10b are extended toward the holes 12' or grooves 12 so that the contacting portions 10a are opposite the IC terminals 16, the IC package 15 is mounted on the IC package mounting table 7, and the contacting portions 10a of the resilient contact pieces 10b are resiliently contacted with the side surface of the IC terminals 16.

In this case, the resilient contact pieces 10b are extended in the vertical direction within the positioning holes 12' or the positioning grooves 12, or only the free ends thereof are extended in the vertical direction, and the root portions thereof are bent in the horizontal direction.

In the above-mentioned embodiments, although there has been described the IC package 15 with leads projecting sideward as the IC terminals 16, the present invention can be applied to a leadless type IC package in which conduction pieces as the IC terminals 16 are intimately attached directly on the outer surface of the IC package.

In the above-mentioned embodiments, although the contacts are provided at the four sides of the periphery of the IC package mounting table 7, the present invention can of course be applied to an IC socket, in which the contacts 10 are provided at the opposite two sides of the periphery of the IC package mounting table 7.

According to the present invention described in the foregoing, the contacts planted in the socket body, particularly the resilient contact pieces to be contacted with the IC terminals and the IC package mounting table are placed in the offsetting relation with respect to each other through the positioning holes or the positioning grooves formed in the IC package mounting table. Accordingly, the resilient contact pieces can be correctly positioned at the IC package mounting table so as to contact with the IC terminals of the IC package correctly mounted on the IC package mounting table.

That is, the IC package mounting table can have the function for positioning the contacts in addition to the function for positioning the IC package when the IC package is correctly mounted on the IC package mounting table. Accordingly, a correct relative position between the IC terminals and the contacts can be ensured by positioning the resilient contact pieces in the vicinity of the contacting portions thereof with the IC terminals at the IC package mounting table. Even when the IC package mounting table is slightly moved in the horizontal direction, the relative position can be ensured since the resilient contact pieces follow the movement thereof.

Due to the above-mentioned arrangement, the present invention can solve the problem related to the positioning of the IC terminals and the contacts in an IC socket provided with an IC package mounting table. Furthermore, since the IC package mounting table has the afore-mentioned positioning functions, the present invention ensures a highly reliable contact and can effectively cope with IC terminals of very small pitches.

While there have been described what are at present considered preferred embodiments of the present invention, it will be obvious to those skilled in the art that many changes and modifications may be made therein without departing from the present invention, and it is, therefore, aimed in the appended claims to cover all such changes and modifications as followed in the true spirit and scope of the present invention.

What is claimed is:

1. An IC socket for an IC package of the type having four sides and a plurality of outwardly extending IC terminals, said socket comprising:
   a socket body defining an IC package accommodating space therein;
   an IC package mounting table vertically and horizontally movably disposed within said IC package accommodating space;
   means on said IC package mounting table for receiving and positioning an IC package thereon, said receiving and positioning means including a positioning wall for regulating the position of four sides of an IC package when an IC package is vertically received on said IC package mounting table in the direction of insertion;
   a plurality of positioning grooves defined on said IC package mounting table for guiding and positioning a plurality of resilient contact pieces;
   a plurality of contacts attached to said socket body, each one of said plurality of contacts having a resilient contact piece for contacting one of the plurality of outwardly extending IC terminals of an IC package when received on said IC package mounting table, and said plurality of resilient contact pieces being positioned by said plurality of positioning grooves on said IC package mounting table;
   a coil spring means attached to said socket body and to said IC package table for resiliently biasing said mounting table vertically upwardly in the direction of insertion of an IC package and for causing horizontal movement of said mounting table when a horizontal force is applied to said mounting table;
   a pressing cover pivotably attached to said socket body for pressing against an IC package received on said IC package mounting table against the vertical and horizontal bias of said coil spring means and for pressing the plurality of outwardly extending terminals of an IC package into contact with said plurality of resilient contact pieces; and
   wherein, when an IC package is received on said IC package mounting table said pressing cover is pivoted against the IC package and presses the plurality of outwardly extending terminals of the IC package against said plurality of resilient contact pieces, and said pressing cover further presses the IC package against the horizontal and vertical bias of said coil spring means whereby said positioning wall further regulates the positioning of the IC package on said mounting table.

2. An IC socket for an IC package of the type having four sides and a plurality of outwardly extending IC terminals, said socket comprising:
   a socket body defining an IC package accommodating space therein;
   an IC package mounting table vertically and horizontally movably disposed within said IC package accommodating space;
   means on said IC package mounting table for receiving and positioning an IC package thereon, said receiving and positioning means including a positioning wall for regulating the position of four sides of an IC package when an IC package is vertically received on said IC package mounting table in the direction of insertion;
   a plurality of positioning holes defined in said IC package mounting table for guiding and positioning a plurality of resilient contact pieces;
   a plurality of contacts attached to said socket body, each one of said plurality of contacts having a resilient contact piece for contacting one of the plurality of outwardly extending IC terminals of an IC package when received on said IC package mounting table, and each one of said plurality of resilient contact pieces being received in and positioned by one of said plurality of positioning holes on said IC package mounting table;
   a coil spring means attached to said socket body and to said IC package table for resiliently biasing said mounting table vertically upwardly in the direction of insertion of an IC package and for causing horizontal movement of said mounting table when a horizontal force is applied to said mounting table;
   a pressing cover pivotably attached to said socket body for pressing against an IC package received on said IC package mounting table against the vertical and horizontal bias of said coil spring means and for pressing the plurality of outwardly extending terminals of an IC package into contact with said plurality of resilient contact pieces; and
   wherein, when an IC package is received on said IC package mounting table said pressing cover is pivoted against the IC package and presses the plurality of outwardly extending terminals of the IC package against said plurality of resilient contact pieces, and said pressing cover further presses the IC package against the horizontal and vertical bias of said coil spring means whereby said positioning wall further regulates the positioning of the IC package on said mounting table.

3. An IC socket for an IC package of the type having four sides, a plurality of outwardly extending IC terminals, and the plurality of IC terminals being distributed among a row of terminals along each one of four sides, said socket comprising:

a socket body defining an IC package accommodating space therein;

an IC package mounting table vertically and horizontally movably disposed within said IC package accommodating space;

means on said IC package mounting table for receiving and positioning an IC package thereon, said receiving and positioning means including four positioning walls for regulating the position of the four sides and corners of an IC package by engaging endmost ones of the rows of IC terminals along each of the four sides of an IC package when an IC package is vertically received on said IC package mounting table in the direction of insertion, and a plurality of positioning grooves for guiding the plurality of outwardly extending IC terminals of an IC package for further regulating the positioning of an IC package when received on said mounting table;

a plurality of contacts attached to said socket body, each one of said plurality of contacts having a resilient contact piece for contacting one of the plurality of outwardly extending IC terminals of an IC package when received on said IC package mounting table, and said plurality of resilient contact pieces being positioned by said plurality of positioning grooves on said IC package mounting table;

a coil spring means attached to said socket body and to said IC package table for resiliently biasing said mounting table vertically upwardly in the direction of insertion of an IC package and for causing horizontal movement of said mounting table when a horizontal force is applied to said mounting table;

a pressing cover pivotably attached to said socket body for pressing against an IC package received on said IC package mounting table against the vertical and horizontal bias of said coil spring means and for pressing the plurality of outwardly extending terminals of an IC package into contact with said plurality of resilient contact pieces; and wherein, when an IC package is received on said IC package mounting table said pressing cover is pivoted against the IC package and presses the plurality of outwardly extending terminals of the IC package against said plurality of resilient contact pieces, and said pressing cover further presses the IC package against the horizontal and vertical bias of said coil spring means whereby said four positioning walls further regulate the positioning of the IC package on said mounting table by engaging the outermost ones of the rows of IC terminals along each of the four sides of the IC package.

* * * * *